(12) United States Patent
Chang et al.

(10) Patent No.: US 10,024,326 B2
(45) Date of Patent: Jul. 17, 2018

(54) SERIES FAN WITH SUPPORT FRAME

(71) Applicant: ASIA VITAL COMPONENTS CO., LTD., New Taipei (TW)

(72) Inventors: Bor-Haw Chang, New Taipei (TW); Yu-Tzu Chen, New Taipei (TW); Chung-Shu Wang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 15/368,700

(22) Filed: Dec. 5, 2016

(65) Prior Publication Data

US 2018/0156221 A1 Jun. 7, 2018

(51) Int. Cl.
| | | |
|---|---|---|
| F04D 19/00 | (2006.01) | |
| F04D 25/08 | (2006.01) | |
| F04D 25/16 | (2006.01) | |
| H05K 7/20 | (2006.01) | |

(52) U.S. Cl.
CPC .......... *F04D 19/007* (2013.01); *F04D 25/08* (2013.01); *F04D 25/16* (2013.01); *F04D 25/166* (2013.01); *H05K 7/20* (2013.01)

(58) Field of Classification Search
CPC ........ F04D 19/007; F04D 25/08; F04D 25/16; F04D 25/166; H05K 7/20172
See application file for complete search history.

(56) References Cited

U.S. PATENT DOCUMENTS

| | | | | |
|---|---|---|---|---|
| 6,678,157 B1* | 1/2004 | Bestwick | ................. | G06F 1/20 165/104.34 |
| 6,940,716 B1* | 9/2005 | Korinsky | ................. | G06F 1/20 165/121 |
| 7,019,969 B2* | 3/2006 | Foster, Sr. | ............ | H01L 23/467 165/185 |
| 7,038,911 B2* | 5/2006 | Foster, Sr. | ............ | H01L 23/467 165/185 |
| 8,951,012 B1* | 2/2015 | Santoro | ................. | F04D 19/024 416/124 |
| 9,332,679 B2* | 5/2016 | Carl, Jr. | ............. | H05K 7/20772 |
| 2005/0195568 A1* | 9/2005 | Shyr | ........................ | G06F 1/20 361/695 |
| 2006/0162340 A1* | 7/2006 | Kuo | ......................... | G06F 1/20 62/3.2 |
| 2007/0284955 A1* | 12/2007 | Chang | ................. | F04D 19/007 310/59 |
| 2008/0314555 A1* | 12/2008 | Wu | ..................... | F28D 15/0266 165/80.3 |

(Continued)

*Primary Examiner* — David M Sinclair
*Assistant Examiner* — Robert Brown
(74) *Attorney, Agent, or Firm* — Jackson IPG PLLC; Demian K. Jackson

(57) ABSTRACT

A series fan with support frame includes a first fan, a second fan and a hollow support frame. The support frame has a first receiving space, a second receiving space, an inlet, an outlet and an inclined passage in communication between the first and second receiving spaces. The first and second receiving spaces are respectively positioned in the support frame in adjacency to the inlet and the outlet. The first and second fans are respectively correspondingly received in the first and second receiving to spaces. A first virtual central line of the first fan and a second virtual central line of the second fan intersect each other in the inclined passage.

10 Claims, 7 Drawing Sheets

(56) References Cited

U.S. PATENT DOCUMENTS

| | | | | |
|---|---|---|---|---|
| 2010/0079944 A1* | 4/2010 | Loth | ............... | H05K 7/20918 |
| | | | | 361/695 |
| 2011/0108250 A1* | 5/2011 | Horng | ............... | G06F 1/28 |
| | | | | 165/121 |
| 2012/0327589 A1* | 12/2012 | Sun | ............... | G06F 1/20 |
| | | | | 361/679.47 |
| 2015/0086351 A1* | 3/2015 | Chang | ............... | F04D 29/601 |
| | | | | 415/213.1 |
| 2015/0226230 A1* | 8/2015 | Chang | ............... | F04D 29/023 |
| | | | | 415/200 |

* cited by examiner

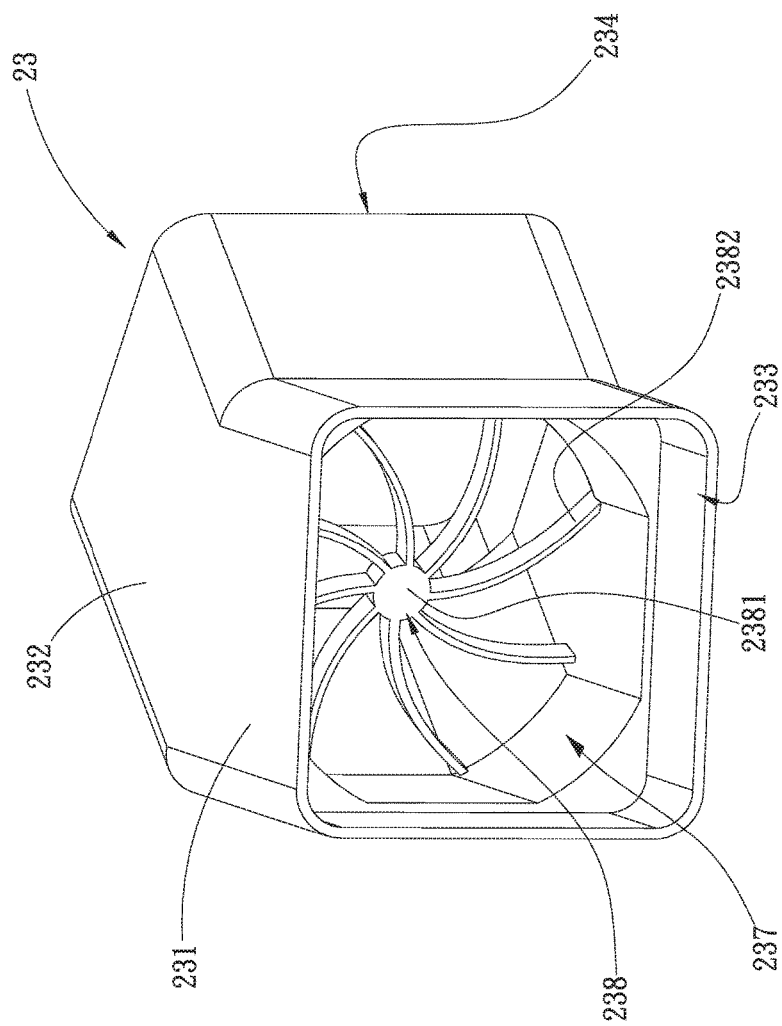

SERIES FAN WITH SUPPORT FRAME

BACKGROUND OF THE INVENTION

1. Field of the Invention

The present invention relates generally to a series fan, and more particularly to a series fan with a support frame, which is able to reduce vibration and lower noise.

2. Description of the Related Art

Along with the advance of science and technologies, the dependence of peoples on various electronic apparatuses has more and more increased. In operation, the internal components of the electronic products (such as computers and notebooks) will generate high heat. The heat generated by the internal components must be conducted outside the electronic product in time. Otherwise, the electronic product will overheat. In general, a fan is disposed in the electronic product to dissipate the heat and keep the electronic product operating at an operation temperature within a certain range. However, in some cases, the wind power provided by one single fan may be insufficient. Therefore, two fans are often serially connected and assembled into a series fan to provide sufficient wind power. Therefore, a conventional series fan is often applied to a high-density server to provide strong air volume for dissipating the heat.

In the internal space of the conventional server, the hard disk is generally positioned right in front of the series fan, while the other components such as the central processing unit (CPU), the graphics processing unit (GPU), the memory card or the control panel are positioned right behind the series fan. In this case, the flow field direction of the airflow of the series fan is lined up with the respective components. Accordingly, the airflow will first flow through the hard disk and then flow through the series fan from the front side thereof. Thereafter, the airflow is exhausted from the rear side of the series fan to blow onto the other components to forcedly dissipate the heat. The conventional series fan is able to achieve heat dissipation effect. However, another problem is derived. As shown in FIG. 1, the air inlet 104 and air outlet 105 of the first fan 10 of the conventional series fan 1 are lined up with the air inlet 114 and air outlet 115 of the second fan 11 serially connected with the first fan 10. In other words, the central lines of the rotors 102, 112 of the two fans 10, 11 are serially connected. Under such circumstance, when the series fan 1 operates, the multiple blades 1031, 1131 of the series fan 1 will periodically bear the pulse effect of the non-uniform airflow on the air inlets and air outlets. This will cause regular dipole noise to make louder periodical noise.

In addition, in the structure of the conventional series fan 1, the fan frame 101 of the first fan 10 and the fan frame 111 of the second fan 11 are serially connected with each other by means of the engagement structures therebetween. In such serial connection manner, the central axes of the fans, (that is, the rotors 102, 112 of the first and second fans 10, 11) are serially connected so that the vibration state is unchangeable. When the fan impellers 103, 113 in the two fan frames 101, 111 simultaneously operate, under the inter-affection of the ground-state vibration frequency of the two fan impellers 103, 113, the two fan frames 101, 111 will severely resonate. The vibration caused by the resonance effect will be directly transmitted to outer side via the fan frames 101, 111. The hard disk in the mainframe system of the electronic product is quite sensitive to the vibration and the traditionally designed one-piece fan frames 101, 111 can hardly effectively reduce the vibration. Therefore, in some more serious cases, the vibration of the motors and the fan impellers 101, 111 will interfere with the normal work of the other electronic components. This will make the system unable to achieve the optimal performance. Moreover, the resonance effect is accompanied with loud noise.

SUMMARY OF THE INVENTION

It is therefore a primary object of the present invention to provide a series fan with a support frame, which is able to lower noise and reduce vibration.

It is a further object of the present invention to provide a series fan with a support frame, which is able to enhance the wind pressure.

To achieve the above and other objects, the series fan with support frame of the present invention includes a first fan, a second fan and a support frame. The support frame is a hollow support frame. The support frame has a first receiving space, a second receiving space, an inlet, an outlet and an inclined passage in communication with the inlet and the outlet. The first and second receiving spaces are respectively positioned in the support frame in adjacency to the inlet and the outlet. The first and second fans are respectively correspondingly received in the first and second receiving spaces. The inclined passage is positioned between the first and second receiving spaces. A first virtual central line of the first fan and a second virtual central line of the second fan intersect each other in the inclined passage. By means of the series fan with the support frame of the present invention, the noise is lowered and the vibration is reduced.

In the above series fan with support frame, the support frame has a first section and a second section. The second section obliquely extends from one end of the first section to the left side or the right side. The inlet is formed at the other end of the first section, while the outlet is formed at one end of the second section distal from the first section. The first receiving space is positioned in the first section in adjacency to the inlet. The second receiving space is positioned in the second section in adjacency to the outlet. A part of the inclined passage is positioned in the first section in communication with the first receiving space, while the other par of the inclined passage is positioned in the second section in communication with the second receiving space.

In the above series fan with support frame, an inward raised section is formed on inner side of the support frame. The raised section is positioned in the inclined passage. The raised section has a first end face and a second end face. The first and second end faces are respectively oppositely positioned in the first and second receiving spaces. The bottom sections of the first and second fans received in the first and second receiving spaces are respectively correspondingly attached to the first and second end faces.

In the above series fan with support frame, the first virtual central line of the first fan horizontally extends in the inclined passage to intersect the obliquely extending second virtual central line of the second fan. The first virtual central line and the second first virtual central line contain an angle.

In the above series fan with support frame, the angle is larger than 90 degrees, but smaller than 180 degrees.

In the above series fan with support frame, the first fan has a first fan frame and a first fan impeller. The first fan frame has a first bearing cup and multiple first connection members. The first bearing cup is disposed at the center of the bottom section of the first fan frame. First ends of the first connection members are connected to an outer circumference of the first bearing cup. Second ends of the first connection members are connected to the bottom section of the first fan frame. The first connection members in the first receiving space are adjacent to the inclined passage. The first fan impeller is received in the first fan frame. The first fan impeller has a first shaft. The first shaft is rotatably disposed in the first bearing cup.

In the above series fan with support frame, the second fan has a second fan frame and a second fan impeller. The second fan frame has a second bearing cup and multiple second connection members. The second bearing cup is disposed at the center of the bottom section of the second fan frame. First ends of the second connection members are connected to an outer circumference of the second bearing cup. Second ends of the second connection members are connected to the bottom section of the second fan frame. The second connection members in the second receiving space are adjacent to the inclined passage. The second fan impeller is received in the second fan frame. The second fan impeller has a second shaft. The second shaft is rotatably disposed in the second bearing cup.

In the above series fan with support frame, the first virtual central line is a phantom extending line of the first shaft of the first fan and the second virtual central line is a phantom extending line of the second shaft of the second fan.

In the above series fan with support frame, at least one flow guide member is disposed in the inclined passage. The flow guide member has a main body and multiple guide blades. First ends of the guide blades are connected to outer circumference of the main body, while second ends of the guide blades are connected to the inner side of the inclined passage.

In the above series fan with support frame, the first connection members are static blades or ribs and the second connection members are static blades or ribs.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 5 is a perspective assembled view of another embodiment of the support frame of the present invention.

DETAILED DESCRIPTION OF THE PREFERRED EMBODIMENTS

Figure 1:
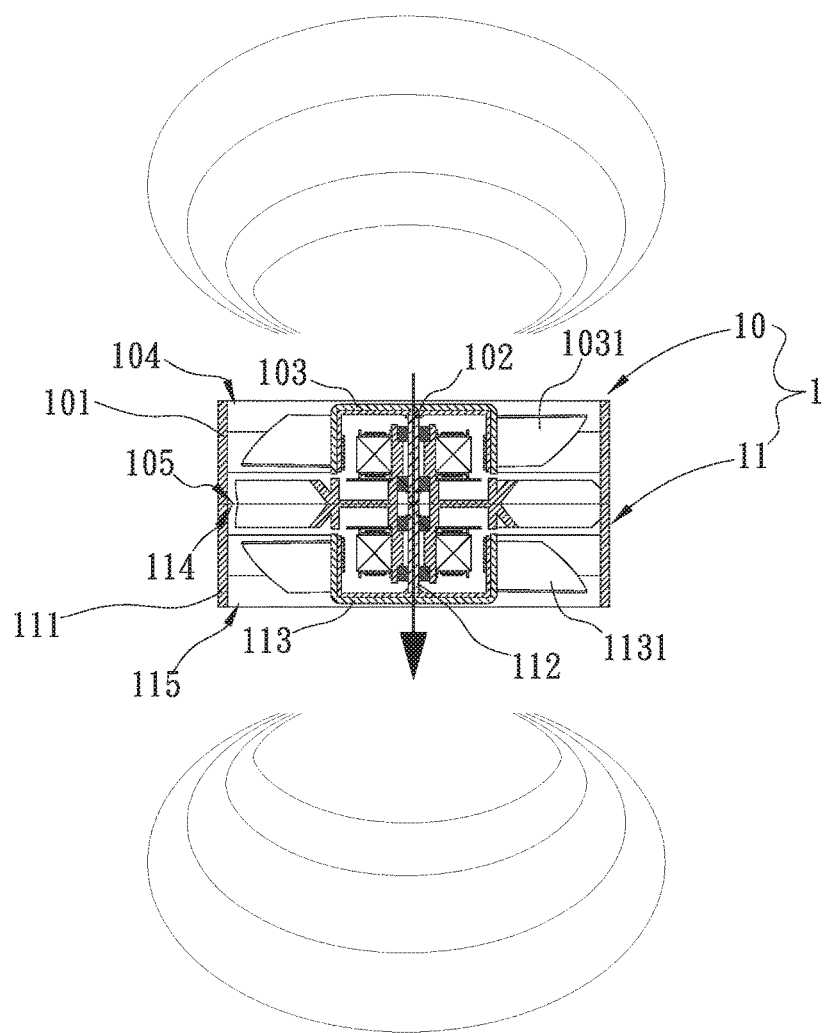
FIG. 1 is a sectional view of a conventional series fan, showing the airflow direction and the dipole noise pattern in operation of the series fan.
Figure 2A:
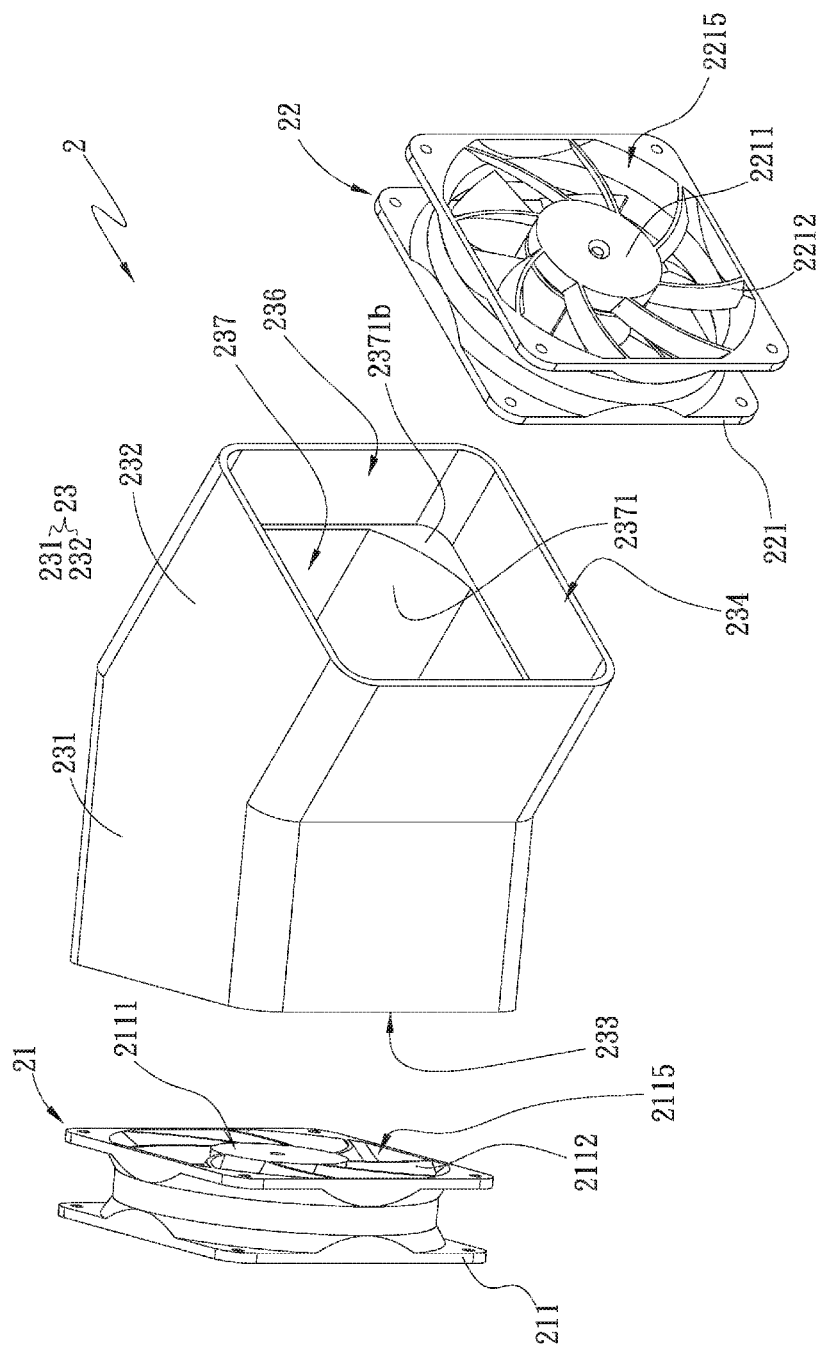
FIG. 2A is a perspective exploded view of a preferred embodiment of the present invention.
Figure 2B:
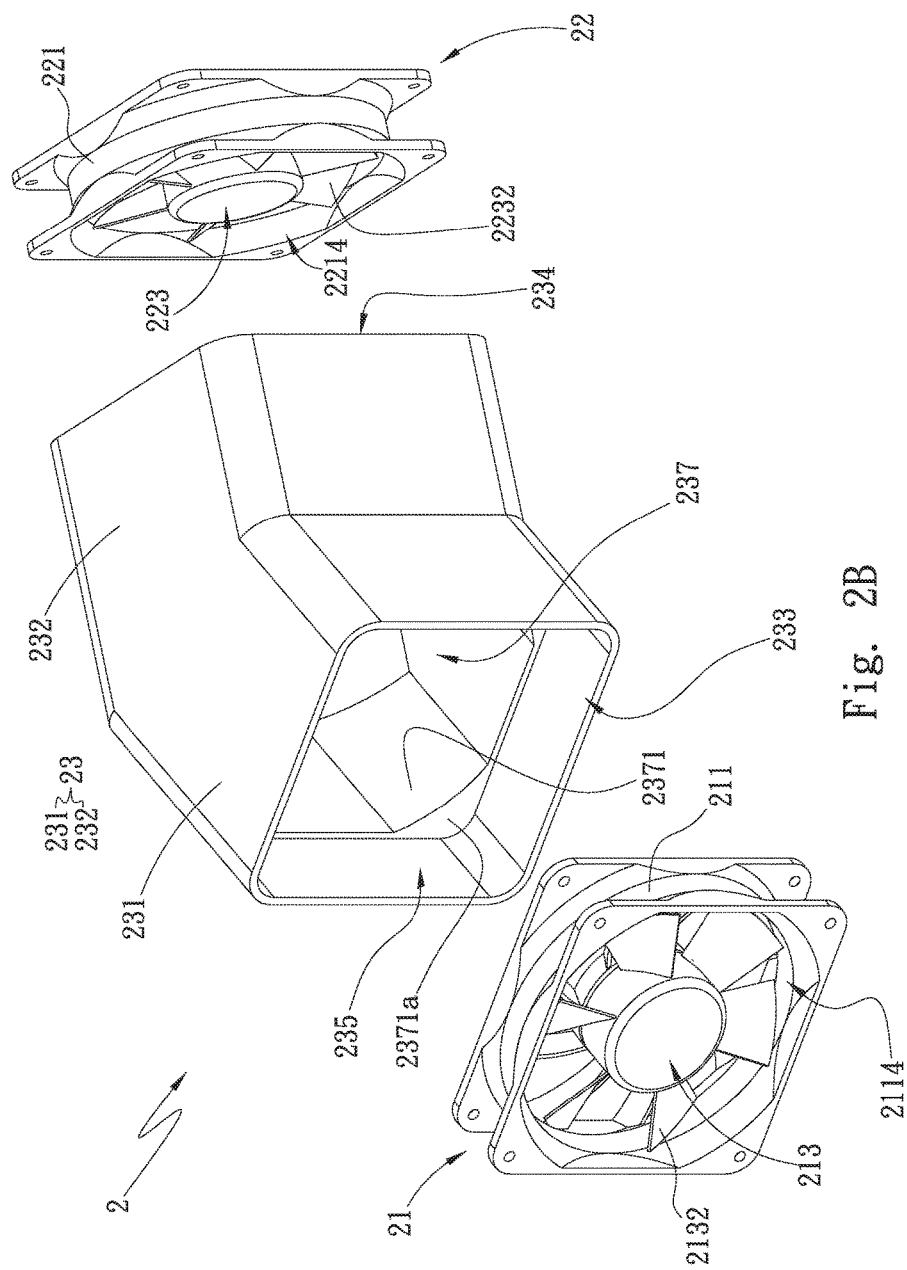
FIG. 2B is another perspective exploded view of the preferred embodiment of the present invention.
Figure 3:
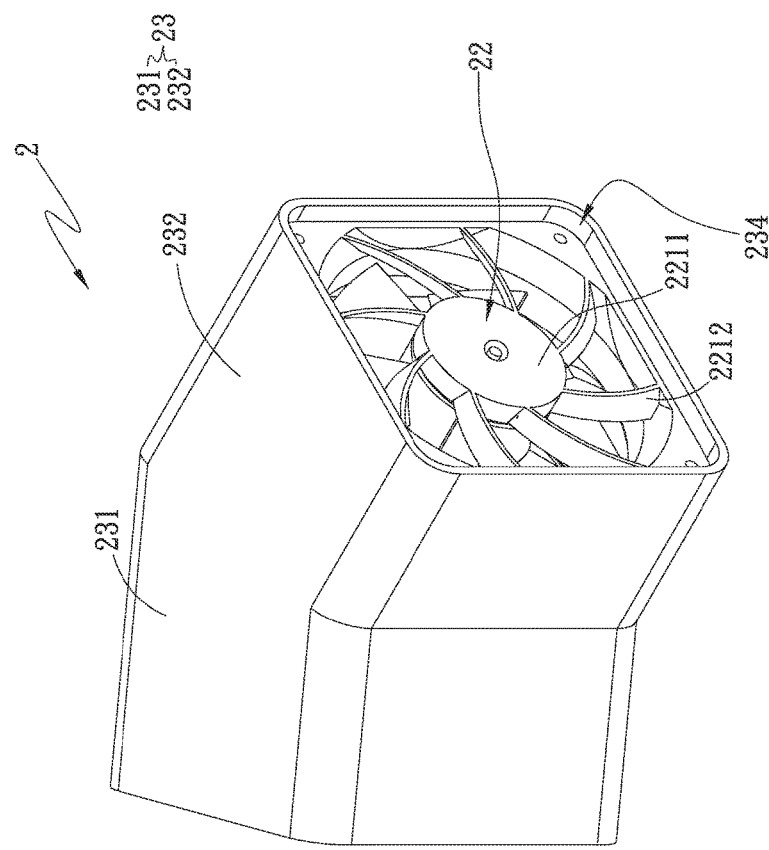
FIG. 3 is a perspective assembled view of the preferred embodiment of the present invention.
Figure 3A:
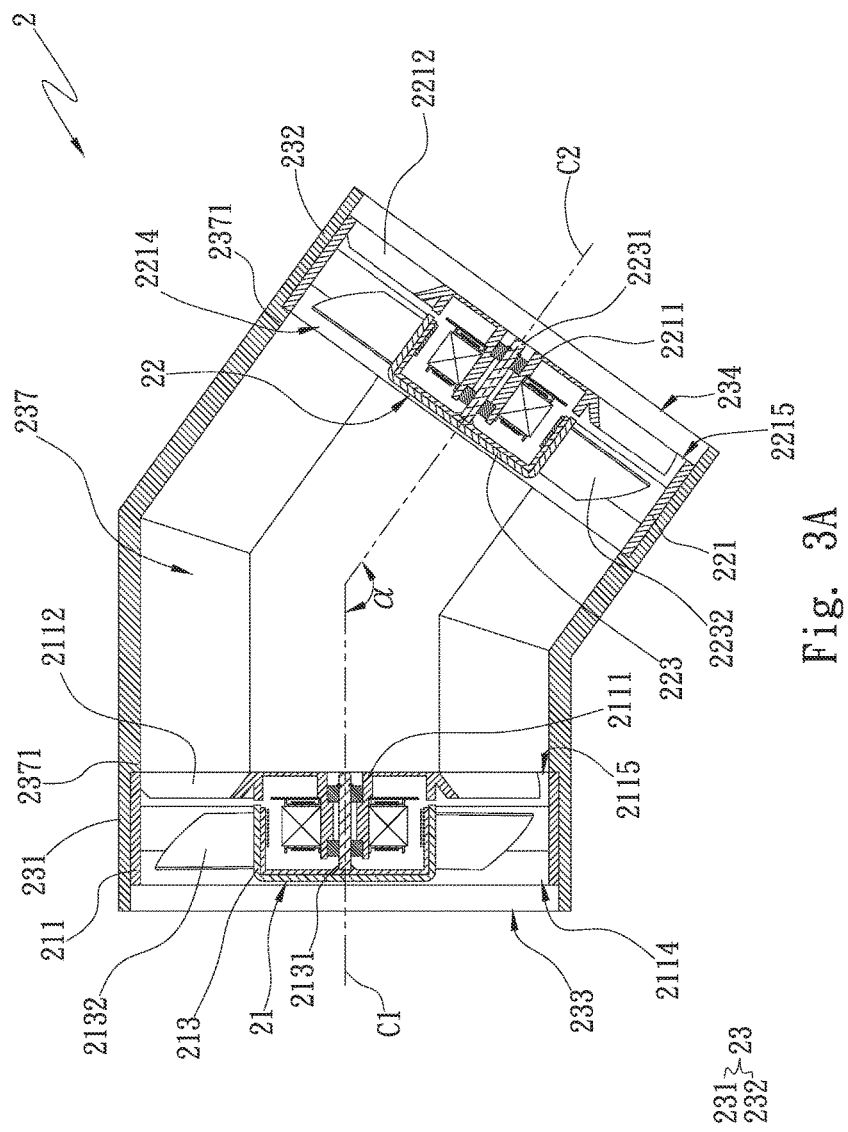
FIG. 3A is a sectional assembled view of the preferred embodiment of the present invention.

Please refer to FIGS. 2A, 2B, 3 and 3A. FIG. 2A is a perspective exploded view of a preferred embodiment of the present invention. FIG. 2B is another perspective exploded view of the preferred embodiment of the present invention. FIG. 3 is a perspective assembled view of the preferred embodiment of the present invention. FIG. 3A is a sectional assembled view of the preferred embodiment of the present invention. The series fan 2 with support frame of the present invention includes a first fan 21, a second fan 22 and a support frame 23. The support frame 23 is a hollow support frame 23. The support frame 23 has a first section 231, a second section 232, a first receiving space 235, a second receiving space 236, an inlet 233, an outlet 234 and an inclined passage 237 in communication with the inlet 233 and the outlet 234. The second section 232 obliquely extends from one end of the first section 231 to the left side or the right side. The first and second sections 231, 232 are integrally connected to form the support frame 23. The inlet 233 and the outlet 234 are respectively formed at two ends of the support frame 23. That is, the inlet 233 is formed at the other end of the first section 231, while the outlet 234 is formed at one end of the second section 232 distal from the first section 231. The inclined passage 237 communicates with the first and second receiving space 235, 236. A part of the inclined passage 237 is positioned in the first section 231 in communication with the first receiving space 235, while the other par of the inclined passage 237 is positioned in the second section 232 in communication with the second receiving space 236. The first receiving space 235 is positioned in the first section 231 in adjacency to the inlet 233 for correspondingly receiving the first fan 21. The second receiving space 236 is positioned in the second section 232 in adjacency to the outlet 234 for correspondingly receiving the second fan 22. By means of the support frame 23, the first and second fans 21, 22 are serially connected with each other to form the series fan 2. In this embodiment, the first and second fans 21, 22 are, but not limited to, secured in the first and second receiving spaces 235, 236 of the support frame 23 by means of adhesion. In practice, the first and second fans 21, 22 can be alternatively respectively secured in the first and second receiving spaces 235, 236 of the support frame 23 by means of latching, locking, insertion or press fit.

An inward raised section 2371 is formed on inner side of the support frame 23. The raised section 2371 is positioned in the inclined passage 237. The raised section 2371 has a first end face 2371a and a second end face 2371b. The first and second end faces 2371a, 2371b are respectively oppositely positioned in the first and second receiving spaces 235, 236. The bottom sections of the first and second fans 21, 22 received in the first and second receiving spaces 235, 236 are respectively correspondingly attached to the first and second end faces 2371a, 2371b. The top sections of the first and second fans 21, 22 are respectively correspondingly positioned at the two openings (the inlet 233 and the outlet 234) of the support frame 23. In addition, a first virtual central line C1 of the first fan 21 and a second virtual central line C2 of the second fan 22 intersect each other in the inclined passage 238. In other words, the first virtual central line C1 of the first fan 21 horizontally extends in the inclined passage 237 to intersect the obliquely extending second virtual central line C2 of the second fan 22. The first virtual central line C1 and the second first virtual central line C2 contain an angle α. The angle α is larger than 90 degrees, but smaller than 180 degrees. In this embodiment, the angle α is 145 degrees.

In this embodiment, the first and second fans 21, 22 are axial-flow fans. The first fan 21 has a first fan frame 211 and a first fan impeller 213. The first fan frame 211 has a first bearing cup 2111, a first air inlet 2114, a first air outlet 2115 opposite to and in communication with the first air inlet 2114 and multiple first connection members 2112. The first air inlet 2114 communicates with the inlet 233 of the support frame 23. The first air outlet 2115 communicates with the inclined passage 237. The first bearing cup 2111 is disposed at the center of the bottom section of the first fan frame 211. In this embodiment, the first connection members 2112 are static blades positioned at the first air outlet 2115. First ends of the first connection members 2112 are connected to an outer circumference of the first bearing cup 2111. Second ends of the first connection members 2112 are connected to the bottom section of the first fan frame 211. The first connection members 2112 of the first fan 21 in the first receiving space 235 are adjacent to the inclined passage 237. The first fan impeller 213 is received in the first fan frame 211 to face the first air inlet 2114. The first fan impeller 213 has multiple first blades 2132 and a first shaft 2131. The first shaft 2131 is rotatably disposed in the first bearing cup 2111. The first virtual central line C1 is a phantom extending line of the first shaft 2131 of the first fan 21.

The second fan 22 has a second fan frame 221 and a second fan impeller 223. The second fan frame 221 has a second bearing cup 2211, a second air inlet 2214, a second air outlet 2215 opposite to and in communication with the second air inlet 2214 and multiple second connection members 2212. The second air inlet 2214 communicates with the inclined passage 237. The second air outlet 2215 communicates with the outlet 234 of the support frame 23. The second bearing cup 2211 is disposed at the center of the bottom section of the second fan frame 221. In this embodiment, the second connection members 2212 are static blades positioned at the second air outlet 2215 to face the outlet 234 of the support frame 23. First ends of the second connection members 2212 are connected to an outer circumference of the second bearing cup 2211. Second ends of the second connection members 2212 are connected to the bottom section of the second fan frame 221. The second fan impeller 223 of the second fan 22 in the second receiving space 236 is received in the second fan frame 221 in adjacent to the inclined passage 237. The second connection members 2212 are received in the second fan frame 221. The second fan impeller 223 has multiple second blades 2232 and a second shaft 2231. The second shaft 2231 is rotatably disposed in the second bearing cup 2211. The second virtual central line C2 is a phantom extending line of the second shaft 2231 of the second fan 22. In a modified embodiment, the first and second connection members 2112, 2212 can be alternatively ribs.

Moreover, in this embodiment, the first and second fans 21, 22 are respectively disposed in the first and second receiving spaces 235, 236 of the support frame 23 in a dynamic blades-static blades/dynamic blades-static blades manner. That is, the first blades 2132 (the dynamic blades) of the first fan impeller 213 of the first fan 21 face the inlet 233 of the support frame 23, while the first connection members 2112 (the static blades) are adjacent to the inclined passage 237. The second blades 2232 (the dynamic blades) of the second fan impeller 223 of the second fan 22 are adjacent to the inclined passage 237, while the second connection members 2212 (the static blades) face the outlet 234 of the support frame 23. In a modified embodiment, the first and second fans 21, 22 are alternatively respectively disposed in the first and second receiving spaces 235, 236 of the support frame 23 in a dynamic blades-static blades/static blades-dynamic blades manner. That is, the first blades 2132 (the dynamic blades) of the first fan impeller 213 of the first fan 21 face the inlet 233, while the first connection members 2112 (the static blades) are adjacent to the inclined passage 237. The second connection members 2212 (the static blades) of the second fan 22 are adjacent to the inclined passage 237, while the second blades 2232 (the dynamic blades) of the second fan impeller 223 face the outlet 234 of the support frame 23.

Figure 4:
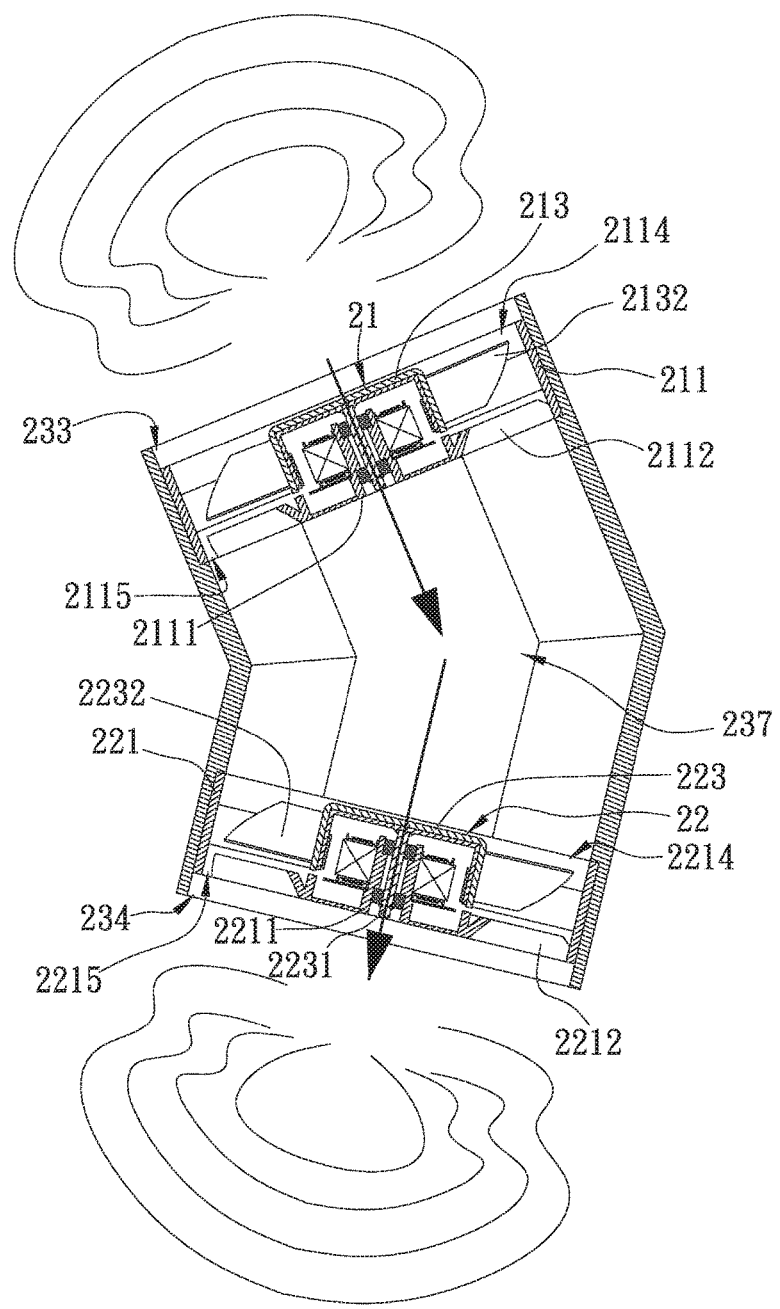
FIG. 4 is a sectional view of the preferred embodiment of the present invention, showing the airflow direction and the dipole noise pattern in operation of the series fan.

Please now refer to FIG. 4. When the series fan 2 operates, the first fan 21 will guide the external airflow to pass through the inlet 233 and flow in from the first air inlet 2114. Then, the airflow flows through the multiple first blades 2132 of the first fan impeller 213. After the first blades 2132 rotate to pressurize the airflow, the first connection members 2112 will disturb and boost the passing airflow. The airflow is then exhausted from the first air outlet 2115 into the inclined passage 237. The second air inlet 2214 of the second fan 22 will suck in the airflow from the inclined passage 237. After the multiple second blades 2232 of the second fan impeller 223 rotate to pressurize the sucked in airflow, the second connection members 2212 will disturb and boost the passing airflow. Then, the airflow is exhausted from the second air outlet 2215 out of the outlet 234.

In addition, the series fan 2 of the present invention can be applied to and mounted in an electronic apparatus such as a high-density server, computer, notebook, communication apparatus or any other device requiring heat dissipation (not shown). With a server taken as an example, the first section 231 of the support frame 23 is disposed behind the hard disk in the server. The second section 232 of the support frame 23 is disposed in front of the other electronic components in the server, (such as the central processing unit (CPU), the graphics processing unit (GPU), the memory card or the control panel). Therefore, the second section 232 of the support frame 23 of the present invention is inclined from the first section 231 so that the support frame 23 has an internal inclined passage 237. Under such circumstance, the first fan 21 and the second fan 22 of the series fan 2 contain the angle α and the first shaft 2131 of the first fan 21 and the second shaft 2231 of the second fan 22 are nonparallel to each other in the support frame 23. In this case, the airflow directions at the inlet 233 and the outlet 234 of the entire series fan 2 are changed so as to destruct the development of the noise dipole and change the audio frequency property. Therefore, the periodical interference effect of the first and second blades 2132, 2232 is reduced to effectively lower the noise.

In the series fan 2 of the present invention, the phantom extending lines (the first and second virtual central lines C1 and C2) of the first and second shafts 2131, 2231 are serially connected in a nonparallel form. This changes the patterns of the airflows at the inlet 233 and the outlet 234. Moreover, due to the resistance of the structure of the series fan 2, the audio frequency of the dipole is destructed so that the periodical noise is effectively reduced. In addition, the phantom extending lines of the first and second shafts 2131, 2231 of the series fan 2 are serially connected in a nonparallel form. Under such circumstance, the first and second fans 21, 22 in the support frame 23 can reduce the vibration frequencies of each other so as to greatly minify the vibration and lower the noise. Besides, the reading efficiency of the hard disk in the system can be enhanced.

Referring to FIG. 5 and supplementally to FIG. 3A, in another embodiment, at least one flow guide member 238 is disposed in the inclined passage 237. The flow guide member 238 has a main body 2381 and multiple guide blades 2382. First ends of the guide blades 2382 are connected to outer circumference of the main body 2381, while second ends of the guide blades 2382 are connected to the inner side of the inclined passage 237. The flow guide member 238 in the inclined passage 237 serves to disturb and boost the passing airflow so as to enhance the wind pressure.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A series fan with support frame, comprising:
    a first fan;
    a second fan; and
    a support frame, the support frame being a hollow support frame, the support frame having a first receiving space, a second receiving space, an inlet, an outlet and an inclined passage in communication with the inlet and the outlet, the first and second receiving spaces being respectively positioned in the support frame in adjacency to the inlet and the outlet, the first and second fans being respectively correspondingly received in the first and second receiving spaces, the inclined passage being positioned between the first and second receiving spaces, a first virtual central line of the first fan and a second virtual central line of the second fan intersecting each other in the inclined passage,
    wherein an inward raised section is formed on inner side of the support frame, the raised section being positioned in the inclined passage, the raised section having a first end face and a second end face, the first and second end faces being respectively oppositely positioned in the first and second receiving spaces, the bottom sections of the first and second fans received in the first and second receiving spaces being respectively correspondingly attached to the first and second end faces.

2. The series fan with support frame as claimed in claim 1, wherein the support frame has a first section and a second section, the second section obliquely extending from one end of the first section to the left side or the right side, the inlet being formed at the other end of the first section, while the outlet being formed at one end of the second section distal from the first section, the first receiving space being positioned in the first section in adjacency to the inlet, the second receiving space being positioned in the second section in adjacency to the outlet, a part of the inclined passage being positioned in the first section in communication with the first receiving space, while the other part of the inclined passage being positioned in the second section in communication with the second receiving space.

3. The series fan with support frame as claimed in claim 1, wherein the first virtual central line of the first fan horizontally extends in the inclined passage to intersect the obliquely extending second virtual central line of the second fan, the first virtual central line and the second first virtual central line containing an angle.

4. The series fan with support frame as claimed in claim 3, wherein the angle is larger than 90 degrees, but smaller than 180 degrees.

5. The series fan with support frame as claimed in claim 1, wherein the first fan has a first fan frame and a first fan impeller, the first fan frame having a first bearing cup and multiple first connection members, the first bearing cup being disposed at the center of the bottom section of the first fan frame, first ends of the first connection members being connected to an outer circumference of the first bearing cup, second ends of the first connection members being connected to the bottom section of the first fan frame, the first connection members in the first receiving space being adjacent to the inclined passage, the first fan impeller being received in the first fan frame, the first fan impeller having a first shaft, the first shaft being rotatably disposed in the first bearing cup.

6. The series fan with support frame as claimed in claim 1, wherein the second fan has a second fan frame and a second fan impeller, the second fan frame having a second bearing cup and multiple second connection members, the second bearing cup being disposed at the center of the bottom section of the second fan frame, first ends of the second connection members being connected to an outer circumference of the second bearing cup, second ends of the second connection members being connected to the bottom section of the second fan frame, the second connection members in the second receiving space being adjacent to the inclined passage, the second fan impeller being received in the second fan frame, the second fan impeller having a second shaft, the second shaft being rotatably disposed in the second bearing cup.

7. The series fan with support frame as claimed in claim 1, wherein the first virtual central line is a phantom extending line of the first shaft of the first fan and the second virtual central line is a phantom extending line of the second shaft of the second fan.

8. The series fan with support frame as claimed in claim 1, wherein at least one flow guide member is disposed in the inclined passage, the flow guide member having a main body and multiple guide blades, first ends of the guide blades being connected to outer circumference of the main body, while second ends of the guide blades being connected to the inner side of the inclined passage.

9. The series fan with support frame as claimed in claim 5, wherein the first connection members are static blades or ribs.

10. The series fan with support frame as claimed in claim 6, wherein the second connection members are static blades or ribs.

* * * * *